(12) United States Patent
Lee et al.

(10) Patent No.: US 8,691,642 B2
(45) Date of Patent: Apr. 8, 2014

(54) METHOD OF FABRICATING SEMICONDUCTOR DEVICE INCLUDING FORMING EPITAXIAL BLOCKING LAYERS BY NITRIDATION PROCESS

(75) Inventors: Jung-Chan Lee, Suwon-si (KR);
Seung-Jae Lee, Hwaseong-si (KR);
Yu-Gyun Shin, Seongnam-si (KR);
Dae-Young Kwak, Seongnam-si (KR);
Byung-Suk Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 54 days.

(21) Appl. No.: 13/238,611

(22) Filed: Sep. 21, 2011

(65) Prior Publication Data

US 2012/0077319 A1    Mar. 29, 2012

(30) Foreign Application Priority Data

Sep. 29, 2010    (KR) .................. 10-2010-0094317

(51) Int. Cl.
*H01L 21/8238*    (2006.01)

(52) U.S. Cl.
USPC .................................. 438/199; 257/E21.632

(58) Field of Classification Search
USPC .................. 438/199, FOR. 187, FOR. 216; 257/E21.632
See application file for complete search history.

(56) References Cited

U.S. PATENT DOCUMENTS

| | | | |
|---|---|---|---|
| 6,900,092 B2 * | 5/2005 | Ajmera et al. | 438/231 |
| 7,659,158 B2 * | 2/2010 | Ma et al. | 438/201 |
| 2010/0078654 A1 | 4/2010 | Okamoto | |
| 2010/0164005 A1 * | 7/2010 | Yu et al. | 257/369 |
| 2010/0224938 A1 * | 9/2010 | Zhu | 257/369 |

FOREIGN PATENT DOCUMENTS

| JP | 2009094225 | 4/2009 |
|---|---|---|
| KR | 1020020028329 A | 4/2002 |

* cited by examiner

*Primary Examiner* — Thanh V Pham
(74) *Attorney, Agent, or Firm* — Volentine & Whitt, PLLC

(57) ABSTRACT

A method of fabricating a semiconductor device includes forming gate structures on PMOS and NMOS transistor regions of the semiconductor substrate, forming epitaxial blocking layers on source/drain regions of PMOS and NMOS transistor regions using a nitridation process, then selectively removing one of the epitaxial blocking layers, and using a SEG process to form an epitaxial layer on respective source/drain regions while shielding the other source/drain regions with a remaining epitaxial blocking layer.

18 Claims, 10 Drawing Sheets

METHOD OF FABRICATING SEMICONDUCTOR DEVICE INCLUDING FORMING EPITAXIAL BLOCKING LAYERS BY NITRIDATION PROCESS

CROSS-REFERENCE TO RELATED APPLICATION

This U.S. non-provisional patent application claims priority under 35 U.S.C. §119 to Korean Patent Application No. 10-2010-0094317 filed Sep. 29, 2010, the subject matter of which is hereby incorporated by reference.

BACKGROUND OF THE INVENTION

The present inventive concept relates to methods for fabricating semiconductor devices. More particularly, the inventive concept relates to methods for fabricating semiconductor devices that incorporate epitaxial blocking layers.

In order to improve the performance of certain types of semiconductor devices, a selective epitaxial growth (SEG) process is used to form elevated source/drain regions.

In a semiconductor device including both a PMOS region and an NMOS region, in order to form different kinds of epitaxial layers in the PMOS region and the NMOS region, epitaxial blocking layers may be formed to prevent a first epitaxial layer associated with a first region from being affected during the fabrication of a second epitaxial layer associated with a second region.

SUMMARY OF THE INVENTION

In certain embodiments of the inventive concept a method of fabricating a semiconductor device is provided. The method includes; forming a first gate structure on a PMOS transistor region of a semiconductor substrate and a second gate structure on a NMOS transistor region of the semiconductor substrate, forming a first epitaxial blocking layer on first source/drain regions associated with the PMOS transistor region and a second epitaxial blocking layer on second source/drain regions associated with of the NMOS transistor region using plasma in a nitrogen-containing atmosphere, removing the first epitaxial blocking layer, and forming a first epitaxial layer on the first source/drain regions of the PMOS transistor region while shielding the second source/drain regions of the NMOS transistor region with the second epitaxial blocking layer.

In other embodiments of the inventive concept, another method of fabricating a semiconductor device is provided. The method comprises; forming a first gate structure on a PMOS transistor region of a semiconductor substrate and a second gate structure on a NMOS transistor region of the semiconductor substrate, forming a SiN first epitaxial blocking layer on first source/drain regions associated with the PMOS transistor region and a second SiN epitaxial blocking layer on second source/drain regions associated with of the NMOS transistor region using a nitridating process that applies a plasma formed in a nitrogen-containing atmosphere to exposed portions of an upper surface of the semiconductor substrate, removing the first SiN epitaxial blocking layer, and using at least one selective epitaxial growth (SEG) process, forming a first SiGe epitaxial layer on the first source/drain regions of the PMOS transistor region while shielding the second source/drain regions of the NMOS transistor region with the second SiN epitaxial blocking layer.

BRIEF DESCRIPTION OF THE DRAWINGS

The above and other features and advantages of the inventive concept will become more apparent upon consideration of certain embodiments thereof with reference to the attached drawings in which.

DETAILED DESCRIPTION

Figure 1:
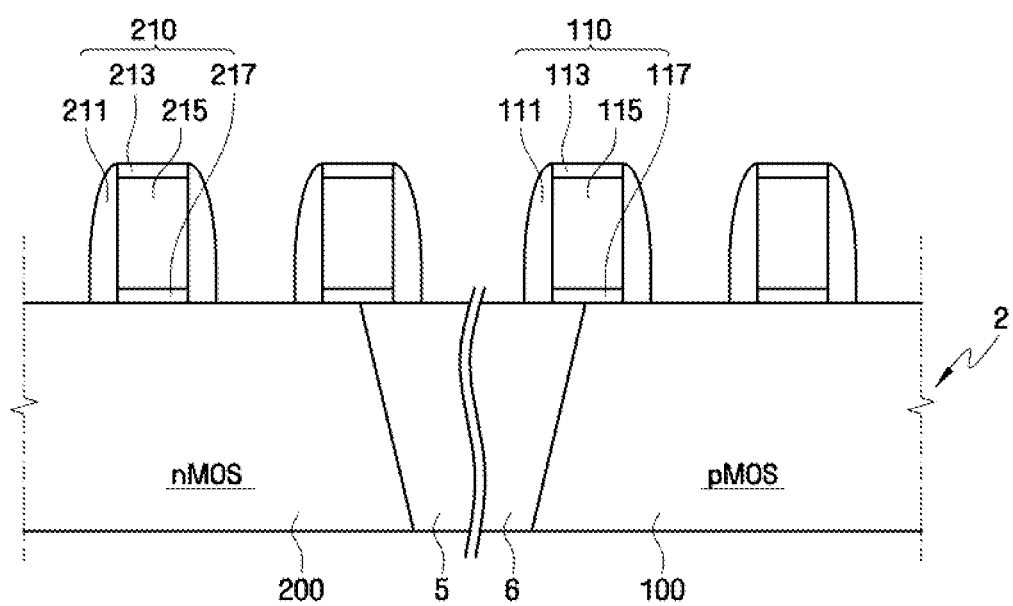
FIGS. 1 to 9 are cross sectional views showing intermediate structures that illustrate methods fabricating certain semiconductor devices according to embodiments of the inventive concept.

Advantages and features of the inventive concept and methods of accomplishing the same may be understood more readily by reference to the following detailed description of embodiments and the accompanying drawings. The present inventive concept may, however, be embodied in many different forms and should not be construed as being limited to only the embodiments set forth herein. Rather, these embodiments are provided so that this disclosure will be thorough and complete and will fully convey the concept of the inventive concept to those skilled in the art. The scope of the inventive concept is defined by the appended claims.

In the drawings, the thickness (and relative thickness) of certain layers and regions have been exaggerated for clarity. Throughout the written description and drawings like reference numbers and labels are used to denote like or similar elements, regions or features.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the inventive concept will be described with reference to a semiconductor device having a polysilicon gate electrode. However, it will be understood by those skilled in the art that the concepts of the inventive concept may be applied to a semiconductor device having a metal gate electrode.

Certain methods for fabricating a semiconductor device according to an embodiment of the inventive concept will be described with reference to FIGS. 1 to 9.

Referring first to FIG. 1, a semiconductor substrate 2 may be formed, including isolation regions 5 and 6 defining an active region, a PMOS transistor region 100, and an NMOS transistor region 200. In addition, first and second gate structures 110 and 210 may be formed on the PMOS transistor region 100 and the NMOS transistor region 200, respectively.

The semiconductor substrate 2 may be made of one or more semiconductor materials including least one selected from the group consisting of Si, Ge, SiGe, GaP, GaAs, SiC, SiGeC, InAs, InP, etc. Semiconductor substrate 2 may be a Silicon On Insulator (SOI) type substrate. The isolation regions 5 and 6 may be formed using LOCal Oxidation of Silicon (LOCOS), Shallow Trench Isolation (STI), and/or similar processes.

The formation of the gate structures 110 and 210 on the semiconductor substrate 2 may include, for example, forming gate insulation film patterns 117 and 217, gate electrodes 115 and 215, gate mask patterns 113 and 213, and gate spacers 111 and 211. That is, a gate insulation layer, gate electrode layer, and gate mask layer may be formed on the semiconductor substrate 2, and then patterned to form the gate insulation film patterns 117 and 217, the gate electrodes 115 and 215, and the gate mask patterns 113 and 213. Next, a gate spacer layer may be formed and anisotropically etched to form the gate spacers 111 and 211 on sidewalls of the gate insulation film patterns 117 and 217, the gate electrodes 115 and 215, and the gate mask patterns 113 and 213.

The gate insulation film patterns 117 and 217 may be made of one or more insulating materials, such as silicon oxide (SiOx), silicon oxynitride (SiON), hafnium oxide (HfOx), aluminum oxide (AlxOy), titanium oxide (TiOx), and/or tantalum oxide (TaOx). The gate insulation film patterns 117 and 217 may be deposited using conventionally understood deposition processes, such as thermal oxidation, atomic layer deposition (ALD), chemical vapor deposition (CVD) and/or sputtering.

The gate electrodes 115 and 215 may be formed on the gate insulation film patterns 117 and 217 from one or more conductive materials. For example, the gate electrodes 115 and 215 may be formed of a polysilicon layer doped with N-type or P-type impurities, a metal layer such as tungsten or molybdenum, a metal silicide layer, and/or a conductive metal containing nitride. The gate electrodes 115 and 215 may be formed from a single film or a stacked collection of films using one or more of the foregoing materials.

The gate spacers 111 and 211 may be made of an insulating material such as silicon oxide, silicon nitride, or silicon oxynitride, and thicknesses thereof may vary according to the specific performance characteristics desired for the constituent semiconductor device. The gate spacers 111 and 211 may be formed of single or multiple layers.

The gate mask patterns 113 and 213 may be made of an insulating material such as silicon oxide, silicon nitride, or silicon oxynitride.

Figure 2:
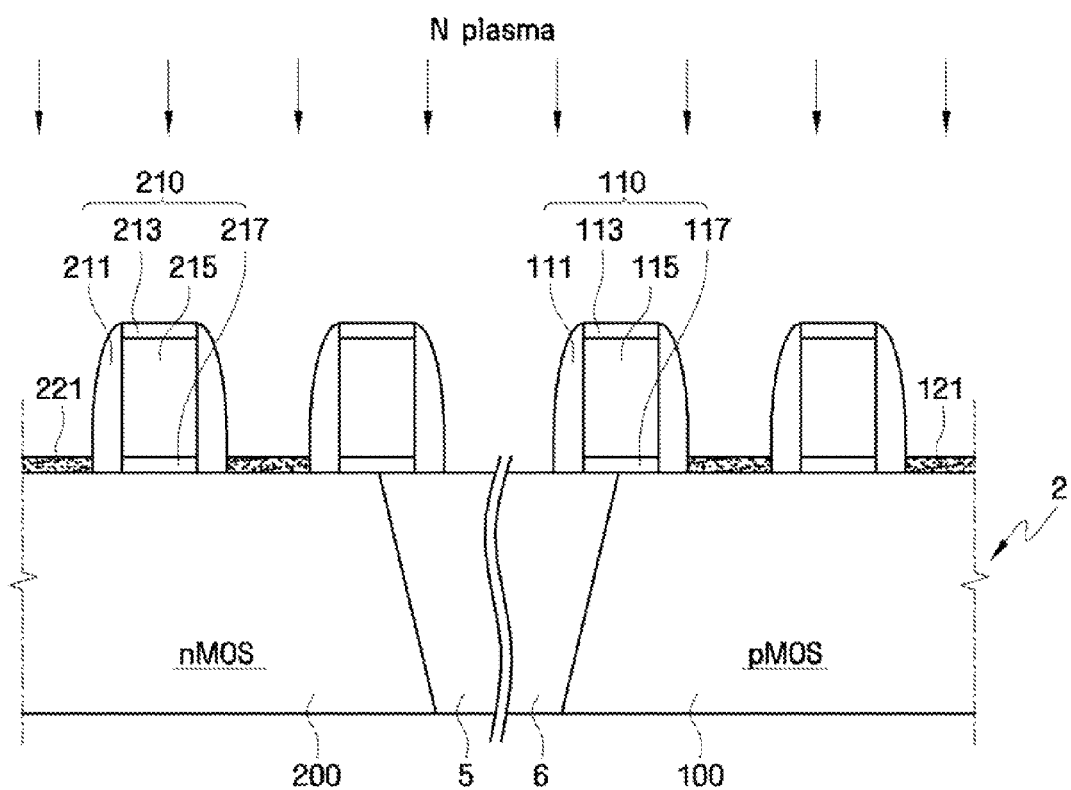

Next, referring to FIG. 2, first and second epitaxial blocking layers 121 and 221 may be formed on the PMOS transistor region 100 and the NMOS transistor region 200, respectively. The epitaxial blocking layers 121 and 221 may be formed by nitridating the upper surface of the semiconductor substrate 2 which includes silicon (Si). The term "nitridating" is used to denote a class of fabrication processes that uses a plasma formed in a nitrogen-containing atmosphere.

In one approach to nitridating, a surface treatment using a plasma formed in a nitrogen-containing atmosphere may applied in situ in a chamber used for epitaxial growth. The plasma may be generated by applying radio frequency (RF) power in a range of from 10 W to 10 kW. The nitrogen-containing atmosphere in the chamber may be maintained under a pressure in a range of from 0.1 mTorr to 20 Torr, and the semiconductor substrate 2 may be maintained at a temperature in a range of from 100 to 700° C. The nitrogen-containing atmosphere may include $NH_3$ of 3 to 500 sccm, $N_2$ gas of 1 to 40000 sccm or a mixture thereof may be used as reactant gas for generating nitrogen plasma. An inert gas, such as Ar, Ne or He, of 0 to 30000 sccm may be injected into the chamber as an atmospheric gas alone or in combination with the reactant gas. However, the nitrogen-containing atmosphere is not limited to only these particular example, but may generally include other nitrogen-containing gases such as NO, $NO_2$, and/or $N_2O$.

Heat treatment for nitridating the surface of the semiconductor substrate 2 may be performed by a nitrogen annealing process or a rapid thermal nitridation process. In addition, the heat treatment may be performed in a $N_2$ atmosphere by injecting $N_2$ into a decoupled plasma nitridation (DPN) equipment. The nitrogen annealing process, RTN, and DPN are well known to those skilled in the art and a description thereof will not be given here.

During the heat treatment stage of the nitridation process, the following chemical reaction occurs on the surface of the semiconductor substrate 2:

$$XSi + YN_2 \rightarrow Si_XN_{2Y} \tag{1}$$

wherein the Si component of the surface of the semiconductor substrate 2 reacts with the nitrogen-containing atmosphere causing the nitridation of Si to thereby form an SiN film.

In a case where the SiN film is formed on the surface of the semiconductor substrate 2, no epitaxial layer may be grown in a region covered by the SiN film even if an SEG process to be described later is performed. Therefore, the SiN film may be effectively used as an epitaxial blocking layer to selectively suppress the growth of an epitaxial layer.

However, the SiN film is not formed entirely on the PMOS transistor region 100 and the NMOS transistor region 200. Nitrogen plasma itself is not deposited on a surface of a layer but is deposited in a nitride state after it reacts with reactants. Since the gate spacers 111 and 211 surrounding peripheral portions of the gate electrodes 115 and 215 and the gate mask patterns 113 and 213 may be made of, for example, SiN, they do not react with nitrogen even when exposed to a nitrogen-based plasma. Therefore, the SiN film is not formed on the gate spacers 111 and 211 and the gate mask patterns 113 and 213. The epitaxial blocking layers 121 and 221 made of SiN are formed only on "exposed portion" of the semiconductor substrate 2 outside the gate electrodes 115 and 215, as disposed on the PMOS transistor region 100 and the NMOS transistor region 200.

By way of comparison, should an epitaxial blocking layer of SiN film be formed on the gate spacers 111 and 211, the epitaxial growth in regions between the gate spacers 111 and gate spacers 211 would be restricted by the thickness of the epitaxial blocking layer formed on the gate spacers 111 and 211. However, when nitridation is performed using a plasma of nitrogen-containing atmosphere, the epitaxial blocking layers 121 and 221 are not formed on the gate spacers 111 and 211. Therefore, the area of the regions between the gate spacers 111 and gate spacers 211 are not reduced by the epitaxial blocking layers 121 and 221. That is, the regions between the gate spacers 111 and gate spacers 211 may be utilized by etching the epitaxial blocking layers 121 and 221 formed on the substrate 2 and disposed on opposite sides of the gate electrodes 115 and 215 during subsequent fabrication processes. In this manner, an open area between the gate spacers 111, and an open area between the gate spacers 211 may be increased. Thus, a much larger area (arbitrarily designated as a "wider" area) may be obtained in forming a silicide layer and a metal contact in subsequent processes. In addition, as the width of the open area is increased, a gap-filling capability is improved and resistance is reduced. Further, a gap-fill margin of a subsequently formed interlayer dielectric (ILD) is improved.

The SiN films of the epitaxial blocking layers 121 and 221 may have thicknesses that range from about of 10 Å to 200 Å. In order to more effectively suppress epitaxial growth, the thickness of the SiN film should be in certain embodiments greater than or equal to 50 Å. The SiN film may be formed to a thickness of greater than or equal to 50 Å using, for example, a high density plasma (HDP) process. The term "HDP process" refers to a class of processes in which plasma density, ion energy and directionality are independently controlled to perform the process without a loss in the selectivity and critical dimension (CD). In one particular example, a competent HDP process plasma may be formed using inductively coupled plasma (ICP). The ICP based plasma is a plasma having cations, electrons and radicals mixed therein, which is produced when the reactant gas is heated to cause atoms or molecules of the reactant gas to violently collide with one another and electrons of the atoms bounce out. Since the HDP process and the ICP process are well known to those skilled in the art, detailed descriptions thereof will not be given here. In order to deposit nitrogen for forming an SiN film, the process is generally performed at relatively high temperature over a relatively long time period. However, in a case of using the HDP process, the process can be performed at relatively low temperature over a relatively short time period, thereby reducing the overall thermal budget of the fabrication process.

Figure 10:
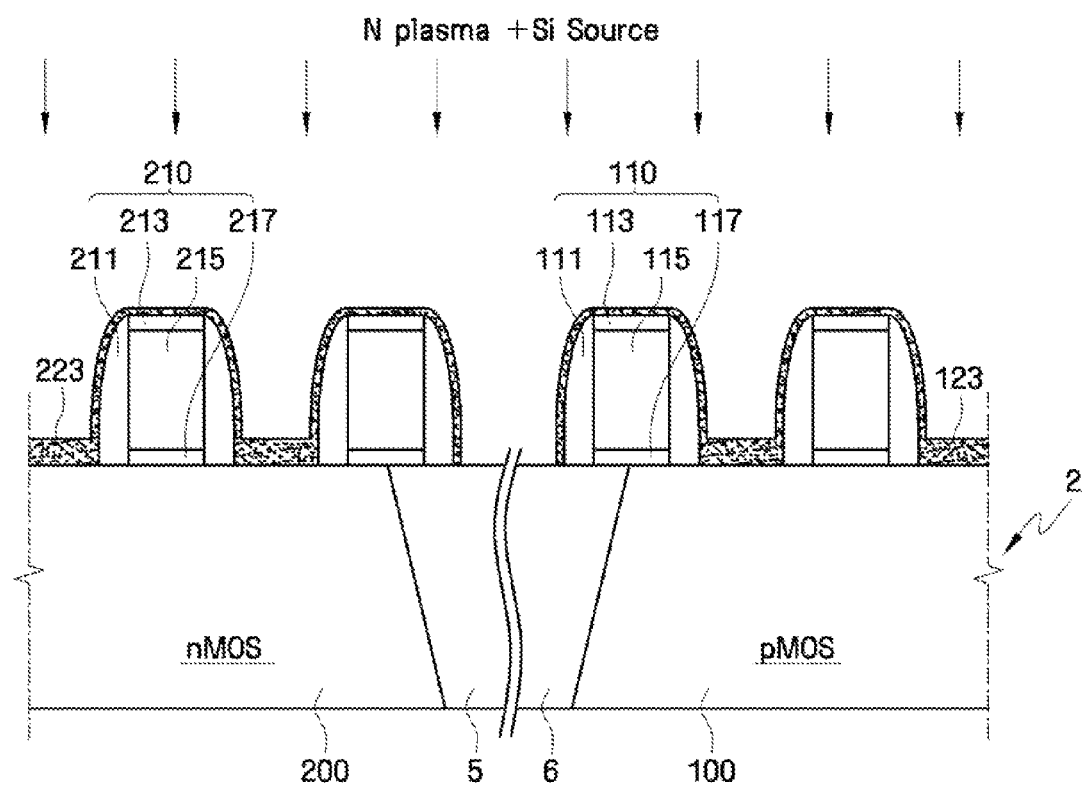
FIG. 10 is a cross sectional view showing an intermediate structure that illustrates a method of fabricating a semiconductor device according to an embodiment of the inventive concept.

Referring to FIG. 10, when the (first and second) epitaxial blocking layers 123 and 223 are to be more thickly formed, an Si source may be applied (e.g., sprayed) while performing nitridation using plasma in a nitrogen-containing atmosphere. The additionally applied Si source reacts with nitrogen, thereby forming a relatively thick SiN film. Therefore, relatively thick (first and second) epitaxial blocking layers 123 and 223 may be obtained. However, in a case of simultaneously performing the spraying of the Si source and the nitridating using N plasma, the SiN film may be formed on the gate spacers 111 and 211 and the gate mask patterns 113 and 213. Here, however, the thickness of the SiN film formed on the gate spacers 111 and 211 and the gate mask patterns 113 and 213 will be smaller than that formed on the source/drain regions. The term "source/drain regions" in this context refers to proximate (or directly adjacent) regions on opposite sides of the gate structures 110 and 210 on the semiconductor substrate 2. Either a source or drain may be subsequently defined in any given source/drain region.

Continuing with the foregoing description, the deposition ratio of the SiN film may be greater than that formed on the gate spacers 111 and 211 and the gate mask patterns 113 and 213 to the SiN film formed on source/drain regions by a ratio of 1/5 or less. In addition, in a case of simultaneously performing the spraying of the Si source and the nitridating using N plasma, the HDP process may be used. As described above, in a case of using the Si source, the SiN film is formed on the gate spacers 111 and 211 as well. In this case, however, the thickness of the SiN film formed on the gate spacers 111 and 211 is less than that of the SiN film formed on the source/drain regions. Thus, the epitaxial blocking layers 123 and 223 formed on the gate spacers 111 and 211 do not severely restrict an open area region later used for the epitaxial layers.

Figure 3:
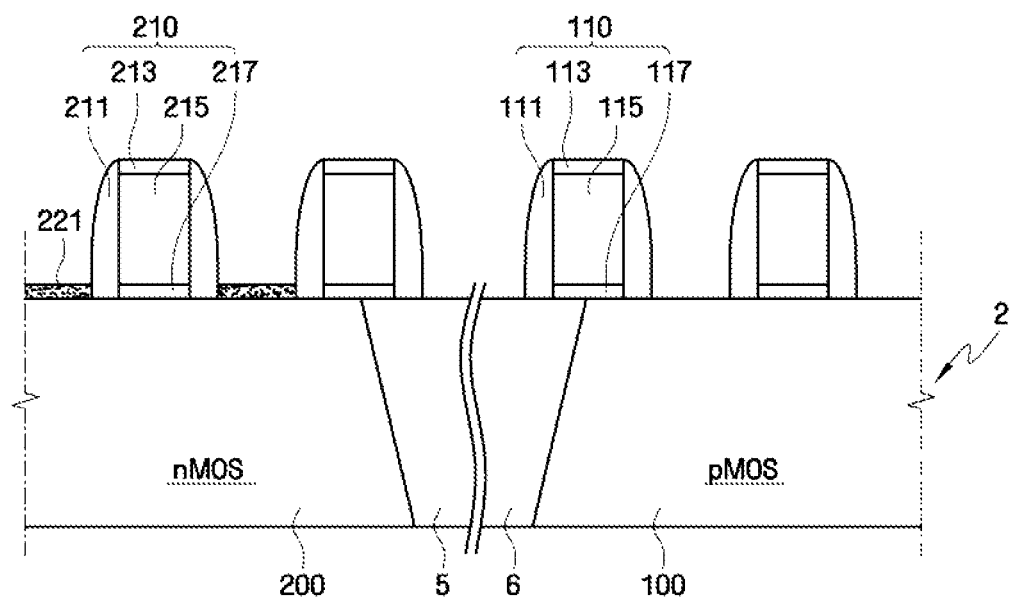

Referring to FIG. 3, the first epitaxial blocking layer 121 formed in the working example on the PMOS transistor region 100 is removed.

In some additional detail, a photoresist pattern (not shown) is coated on an NMOS transistor region 200 and anisotropically etched by, for example, wet etching using HF/ozone water, or reactive ion etching (RIE), thereby selectively etching the first epitaxial blocking layer 121 of the PMOS transistor region 100.

Figure 4:
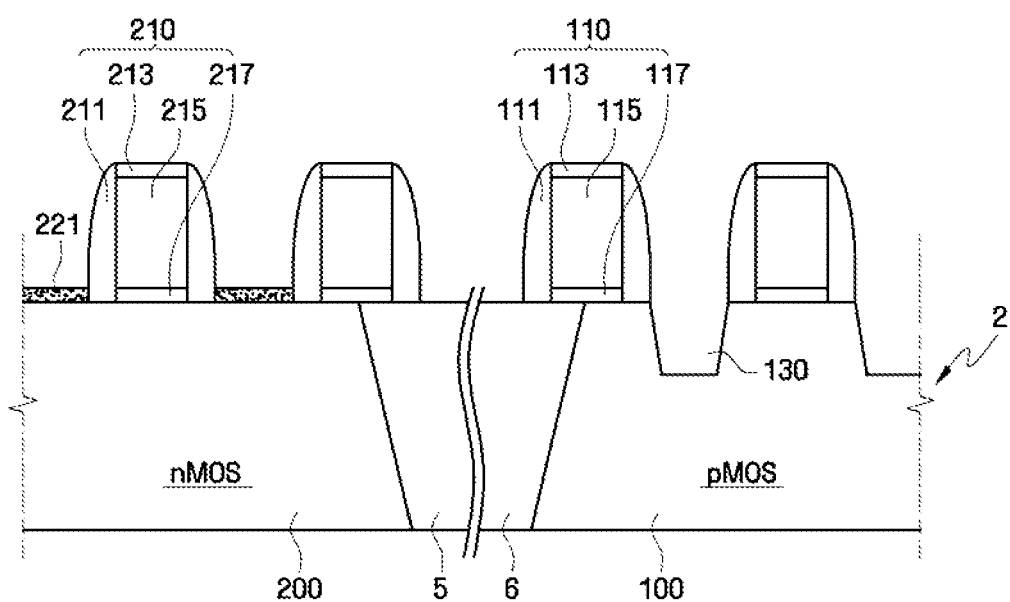

Referring to FIG. 4, a trench 130 may now be formed in the PMOS transistor region 100.

The semiconductor substrate 2 is etched using the gate spacers 111 and 211, the gate mask patterns 113 and 213 and the second epitaxial blocking layer 221 of the NMOS transistor region 200 as masks, thereby forming the trench 130 in source/drain regions of the PMOS transistor region 100. The substrate 2 may be etched, for example, using wet etching or RIE.

Since the second gate spacer 211, the second gate mask pattern 213 and the second epitaxial blocking layer 221 are formed in the NMOS transistor region 200, the etching process scarcely affects the NMOS transistor region 200. The process of forming the trench 130 is not limited to the process illustrated herein. Alternatively, a photoresist pattern (not shown) may be coated on the NMOS transistor region 200, followed by etching, if necessary. In addition, as shown in FIG. 4, the shape of the trench 130 is not limited to a trapezoidal shape, as shown in FIG. 4, and the trench 130 may have a hexagonal shape, for example.

Figure 5:
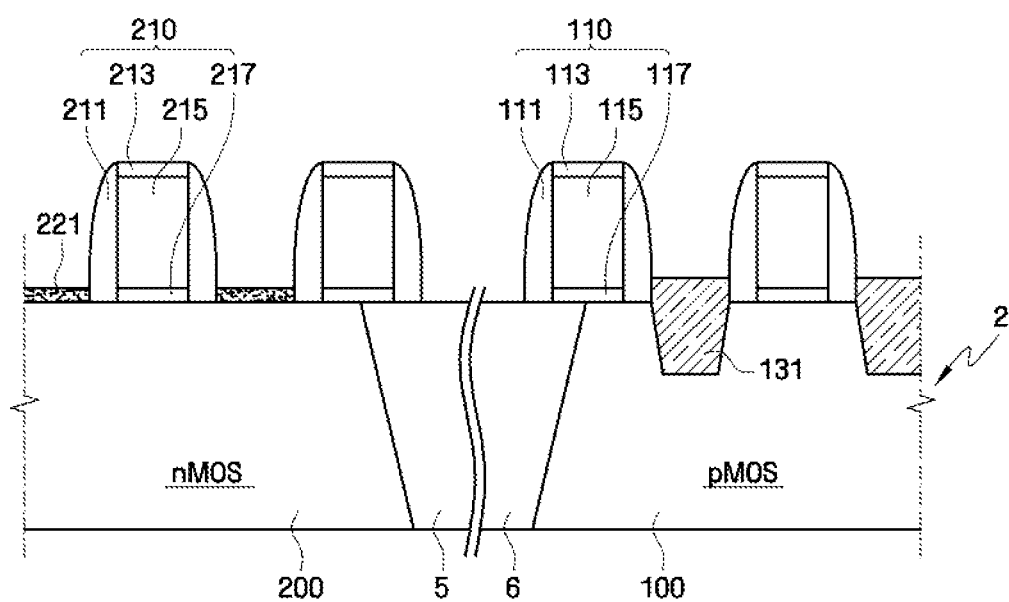

Referring to FIG. 5, a first SiGe epitaxial layer 131 may now be formed to fill the trench 130 of the PMOS transistor region 100. That is, the first SiGe epitaxial layer 131 filling the trench 130 may be used to form a source/drain using an appropriate source gas. In one particular example, the formation of the first SiGe epitaxial layer 131 may include performing a selective epitaxial growth (SEG) process using source gas containing Si. The SEG process may be performed by chemical vapor deposition (CVD), reduced pressure chemical vapor deposition (RPCVD), or ultra high vacuum chemical vapor deposition (UHVCVD), but similar deposition processes may be used alternately or in addition.

The source gas will include Si, as exemplified by but not limited to, any one or more of dichlorosilane ($SiCl_2H_2$), silane ($SiH_4$), etc. The source gas may also include germanium, for example, GeHxCly such as $GeH_4$, $Ge_2H_6$, or GeCl. Here, the concentration of germanium in the first SiGe epitaxial layer 131 can be changed in various conventionally understood manners by adjusting the content of germanium included in the source gas. The concentration of germanium in the first SiGe epitaxial layer 131 may be in a range of from 5 to 50%, for example.

Although not shown, impurity doping may be performed in situ during a SEG process. Alternatively, impurity doping may be performed separately after the SEG process. For example, one or more P-type impurities may be doped by spraying of the source gas.

The term "SEG process" refers to a class of treatment processes using both a gas with crystals unselectively grown on an Si crystal layer or an insulation layer, and an etching gas for removing slowly growing crystals on the insulation layer. An HCl gas may be used as the etching gas. In the SEG process, crystals grow fast on a surface of the semiconductor substrate 2, so that an amount of the crystals grown on the surface of the semiconductor substrate 2 is greater than an amount of crystals removed by etching. As a result, crystals may be grown on the surface of the semiconductor substrate 2. However, on the exposed surfaces of the isolation regions 5 and 6, gate spacers 111 and 211 and gate mask patterns 113 and 213 a small quantity of crystals will also be grown. Yet, the amount of removed crystals on these regions is greater than the amount of crystals grown. As a result, crystals do not accumulate on the surfaces of the isolation regions 5 and 6, gate spacers 111 and 211 and gate mask patterns 113 and 213. Accordingly, the SiGe epitaxial layer 131 may be selectively formed in the trench 130.

As shown in FIG. 5, the first SiGe epitaxial layer 131 fills the trench 130 and extends upward above the upper surface of the semiconductor substrate 2. Alternatively, the first SiGe epitaxial layer 131 may be formed to only a level equal with the upper surface of the semiconductor substrate 2. If necessary, the first SiGe epitaxial layer 131 may be formed on the surface of the semiconductor substrate 2 without forming the trench 130. The shape of the first SiGe epitaxial layer 131 is not limited to the trapezoidal shape shown in FIG. 5, but may have any reasonably formed shape, such as a hexagonal shape, for example.

Figure 6:
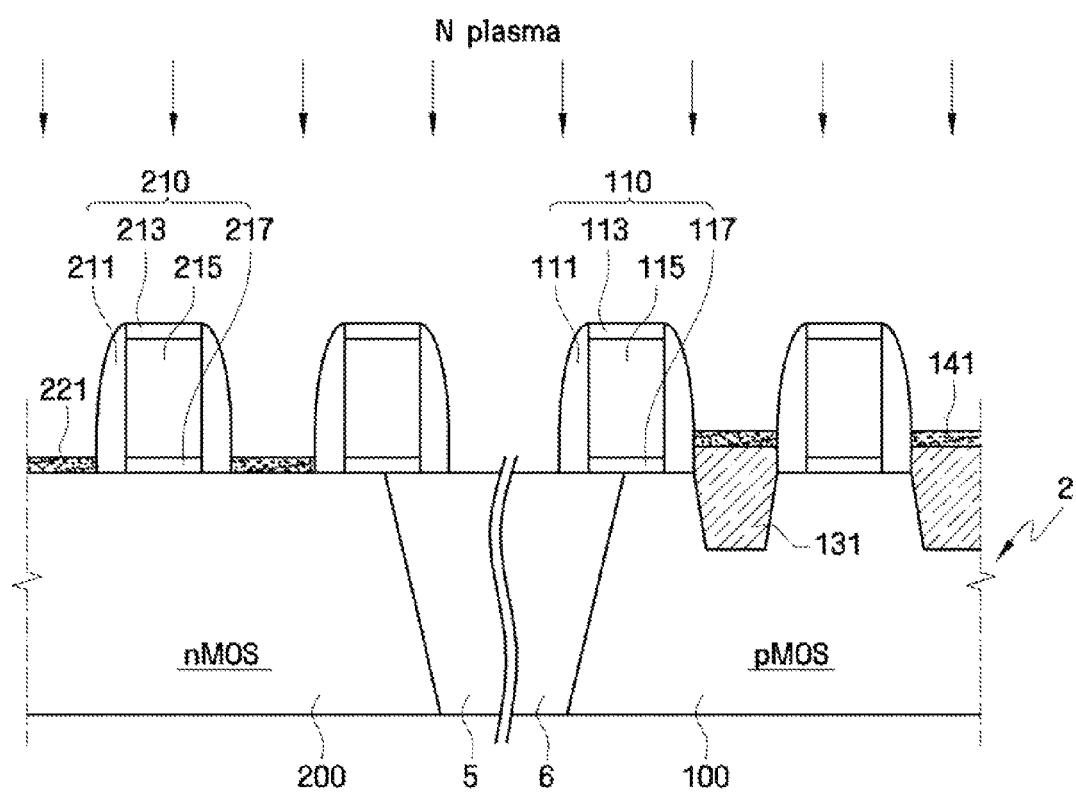

Referring to FIG. 6, a third epitaxial blocking layer 141 may now be formed on the PMOS transistor region 100 by, for example, performing nitridation on an upper surface of the SiGe epitaxial layer 131 using a plasma formed in a nitrogen-containing atmosphere in a manner substantially similar to that described in relation to FIG. 2.

Figure 7:
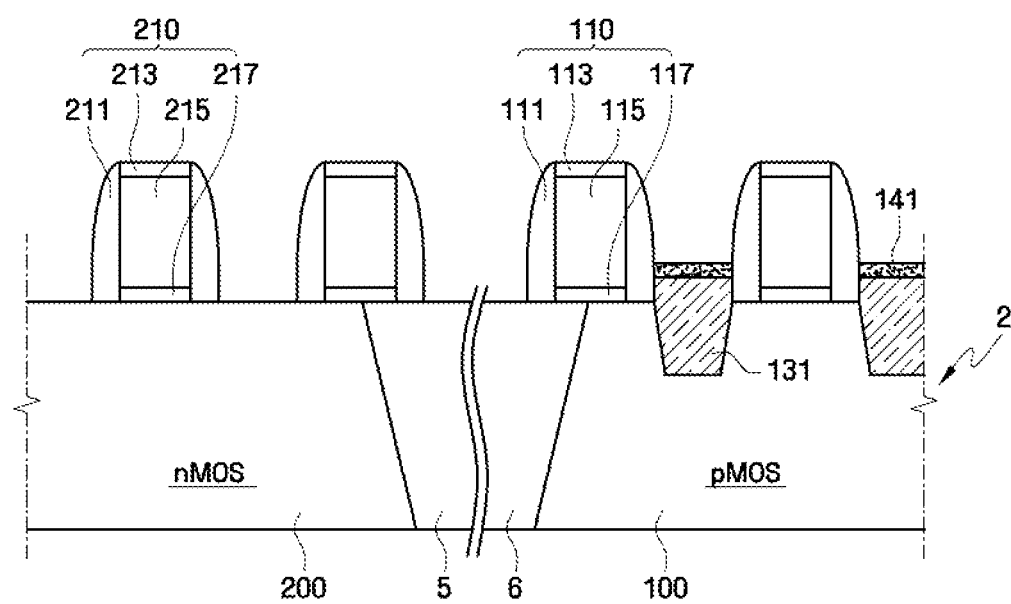

Referring to FIG. 7, the second epitaxial blocking layer 221 may now be removed from the NMOS transistor region 200.

As before, a photoresist pattern (not shown) is coated on the PMOS transistor region 100 and anisotropically etching by, for example, wet etching using HF/ozone water, or reactive ion etching (RIE), thereby selectively etching the second epitaxial blocking layer 221 of the NMOS transistor region 200.

Figure 8:
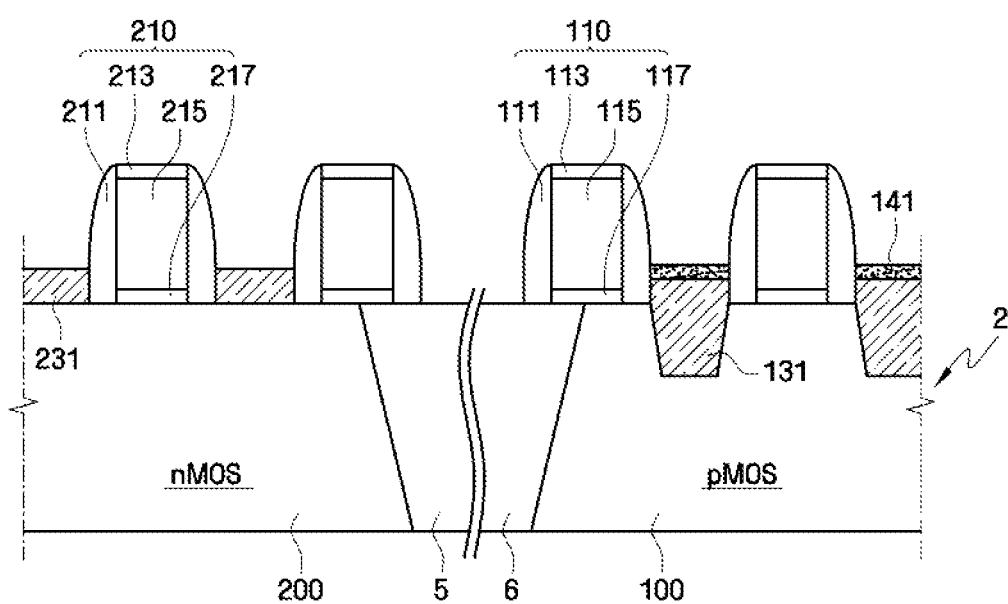

Referring to FIG. 8, a second SiC epitaxial layer 231 may be formed on source/drain regions of the NMOS transistor region 200.

The crystals including Si, for example, SiC crystals, are grown on the source/drain regions of the transistor region 200 to form the second SiC epitaxial layer 231. Here, N-type impurities may be doped into the crystals including Si using an in-situ doping process at the same when growing the crystals including Si. It is not necessary to induce activation of N-type impurities injected by high-temperature treatment such as a spike process or a rapid thermal annealing (RTA) process, through the use of the in-situ doping process for N-type impurity doping, unlike an ion doping process, thereby reducing a thermal budget of the second SiC epitaxial layer 231. Alternatively, other embodiments of the inventive concept are not limited to the process illustrated herein, but the second SiC epitaxial layer 231 may be formed and N-type impurities may then be doped.

In a case where the SiC crystals are used as the epitaxial layer, they may be epitaxially grown using, for example, an SEG process performed in a temperature range of from 700 to 900° C. During the SEG process, crystals grow fast on the surface of the semiconductor substrate 2, so that an amount of the crystals grown on the surface of the semiconductor substrate 2 is greater than an amount of crystals removed by etching. As a result, crystals may grow on the surface of the semiconductor substrate 2. However, on surfaces of the isolation regions 5 and 6, gate spacers 111 and 211 and gate mask patterns 113 and 213 a smaller amount of the crystals are grown than are removed. As a result, crystals are not accumulated on the surfaces of the isolation regions 5 and 6, gate spacers 111 and 211 and gate mask patterns 113 and 213. Accordingly, the second SiGe epitaxial layer 231 may be selectively formed on the source/drain regions of the NMOS transistor region 200.

Subsequently, the third epitaxial blocking layer 141 of the PMOS transistor region 100 may be anisotropically etched by, for example, wet etching using HF/ozone water, or selective reactive ion etching (RIE), thereby etching the third epitaxial blocking layer 141 from the PMOS transistor region 100.

Figure 9:
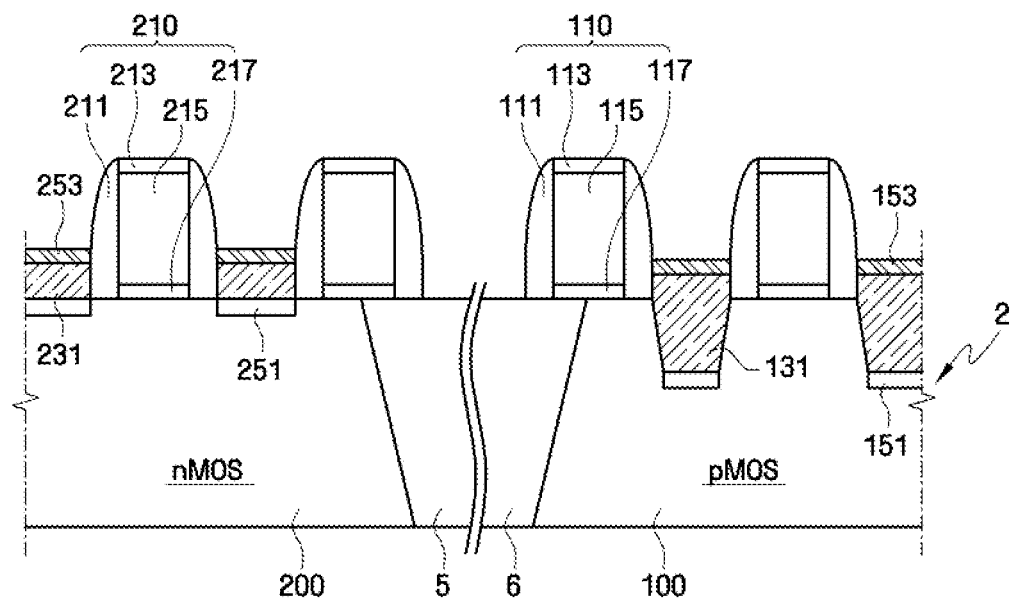

Next, referring to FIG. 9, a P-type impurity region 151 and an N-type impurity region 251 may be respectively formed.

The PMOS transistor region 100 is shielded using a mask (not shown), and a P-type impurity, for example, arsenic (As), may be doped using the NMOS transistor region 200 as an ion implantation mask, thereby forming the N-type impurity region 251 in the NMOS transistor region 200. In addition, the NMOS transistor region 200 is shielded using a mask (not shown), and P-type impurity, for example, boron (B), may be doped using the PMOS transistor region 100 as an ion implantation mask, thereby forming the P-type impurity region 151 in the PMOS transistor region 100. As described above, the P-type impurity doping and the N-type impurity doping may be performed in-situ during the epitaxial growth, unlike the process shown in FIG. 9 in which impurity doping and epitaxial growth are separately performed.

Referring again to FIG. 9, first and second silicide layers 153 and 253 may be respectively formed on the first SiGe epitaxial layer 131 and the second SiC epitaxial layer 231.

In some additional detail, a metal layer may be formed on the semiconductor substrate 2 and, for example, heat treatment, is then performed, thereby forming first and second silicide layers 153 and 253. Here, the formation of the metal layer may include forming the metal layer on the entire surface of the semiconductor substrate 2 using a sputtering process. Alternatively, the metal layer may be selectively formed on surfaces of the epitaxial layers 131 and 231 or the gate structures 110 and 210. Next, heat treatment may be performed to form the first and second silicide layers 153 and 253. The processes of forming silicide layers and removing un-reacted portions of the metal layer are well known to those skilled in the art, descriptions thereof will not be given here.

While formation of the first SiGe epitaxial layer 131 on the PMOS transistor region is first performed in the above-described embodiments, other embodiments of the inventive concept are not limited thereto but the second SiC epitaxial layer 231 formed on the NMOS transistor 200 region may be first formed.

While the present inventive concept has been particularly shown and described with reference to exemplary embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a semiconductor device, the method comprising:

forming, at an upper surface of a semiconductor substrate, a first gate structure on a PMOS transistor region of the semiconductor substrate and a second gate structure on a NMOS transistor region of the semiconductor substrate;

nitridating the upper surface of the semiconductor substrate having the first and second gate structures thereon to form a first epitaxial blocking layer on first source/drain regions associated with the PMOS transistor region and a second epitaxial blocking layer on second source/drain regions associated with the NMOS transistor region, wherein the nitridating comprises forming plasma in a nitrogen-containing atmosphere and exposing the semiconductor substrate having the first and second gate structures thereon to the plasma;

removing the first epitaxial blocking layer;

forming a first epitaxial layer on the first source/drain regions of the PMOS transistor region while shielding the second source/drain regions of the NMOS transistor region with the second epitaxial blocking layer;

nitridating the upper surface of the first epitaxial layer to form a third epitaxial blocking layer on the first source/drain regions associated with the PMOS transistor region, wherein the nitridating comprises forming plasma in a nitrogen-containing atmosphere and exposing the semiconductor substrate having the first and second gate structures thereon to the plasma;

removing the second epitaxial blocking layer; and forming a second epitaxial layer on the second source/drain regions of the NMOS transistor region while shielding the first epitaxial layer with the third epitaxial blocking layer.

2. The method of claim 1, wherein the first and second epitaxial blocking layers are not formed on the first and second gate structures while the upper surface of the semiconductor substrate is being nitridated.

3. The method of claim 2, wherein the first gate structure comprises a first gate electrode, a first gate mask pattern formed on the first gate electrode, and a first gate spacer formed on sidewalls of the first gate electrode, and the second gate structure comprises a second gate electrode, a second gate mask pattern formed on the second gate electrode, and a second gate spacer formed on sidewalls of the second gate electrode.

4. The method of claim 1, wherein forming the first epitaxial layer on the first source/drain regions of the PMOS transistor region comprises:

after removing the first epitaxial blocking layer, forming respective trenches in the first source/drain regions of the PMOS transistor region; and forming the first epitaxial layer to at least fill the respective trenches.

5. The method of claim 4, wherein the first and second epitaxial blocking layers include SiN, and the first epitaxial layer includes SiGe.

6. The method of claim 1, wherein the first and second epitaxial blocking layers have a thickness that ranges from about 10 Å to 200 Å.

7. The method of claim 1, wherein the nitrogen-containing atmosphere includes at least one of $N_2$, $NH_3$, $NO$, $NO_2$, and $N_2O$.

8. The method of claim 1, wherein the nitridating comprises at least one of decoupled plasma nitridation (DPN), rapid thermal nitridation (RTN), and nitrogen annealing process.

9. The method of claim 1, wherein the nitridating comprises a High Density Plasma (HDP) process, carried out while the semiconductor substrate is maintained at a temperature in a range of from 100 to 700° C.

10. The method of claim 9, wherein the supplying the semiconductor substrate and the first and second gate electrode structures with a source of silicon while the semiconductor substrate and the first and second gate electrode structures are being exposed to the plasma, such that the first and second epitaxial blocking layers are also formed on the first and second gates structures, respectively.

11. The method of claim 10, wherein a deposition thickness ratio of the source of silicon to a reactant of nitrogen in the nitrogen-containing atmosphere is 1/5 or less, and the source of silicon is deposited on lateral surfaces of the first and second gate structures, the first source/drain regions of the PMOS transistor region, and the second source/drain regions of the NMOS transistor region.

12. The method of claim 1, further comprising:

after forming the first epitaxial layer on the first source/drain regions of the PMOS transistor region, forming a third epitaxial blocking layer on the first epitaxial layer;

removing the second epitaxial blocking layer; and forming a second epitaxial layer on the second source/drain regions of the NMOS transistor region while shielding the first epitaxial layer with the third epitaxial blocking layer.

13. The method of claim 12, wherein the first and second epitaxial blocking layers are not formed on the first and second gate structures while the upper surface of the semiconductor substrate is being nitridated.

14. The method of claim 1, wherein the first epitaxial layer is formed to a level above a level of an upper surface of the semiconductor substrate.

15. A method of fabricating a semiconductor device, the method comprising:

forming, at an upper surface of a semiconductor substrate comprising silicon, a first gate structure on a PMOS transistor region of the semiconductor substrate and a second gate structure on a NMOS transistor region of the semiconductor substrate such that the gate structures expose portions of the upper surface;

nitridating the upper surface of the semiconductor substrate to form a first SiN epitaxial blocking layer on first source/drain regions associated with the PMOS transistor region and a second SiN epitaxial blocking layer on second source/drain regions associated with the NMOS transistor region, wherein the nitridating comprises forming a plasma formed in a nitrogen-containing atmosphere and treating the exposed portions of the upper surface of the semiconductor substrate with the plasma;

removing the first SiN epitaxial blocking layer;

using at least one selective epitaxial growth (SEG) process, forming a first SiGe epitaxial layer on the first source/drain regions of the PMOS transistor region while shielding the second source/drain regions of the NMOS transistor region with the second SiN epitaxial blocking layer;

nitridating the upper surface of the first SiGe epitaxial layer to form a third SiN epitaxial blocking layer, wherein the nitridating comprises forming plasma in a nitrogen-containing atmosphere and treating the exposed portions of the upper surface of the semiconductor substrate with the plasma;

removing the second SiN epitaxial blocking layer; and using at least one selective epitaxial growth (SEG) process, forming a second SiGe epitaxial layer on the second source/drain regions of the NMOS transistor region while shielding the first SiGe epitaxial layer with the third SiN epitaxial blocking layer.

16. The method of claim 15, wherein the first and second SiN epitaxial blocking layers are not formed on the first and second gate structures while the exposed portions of the upper surface of the semiconductor substrate are being nitridated.

17. The method of claim 15, wherein the nitridating comprises a High Density Plasma (HDP) process, carried out while the semiconductor substrate is maintained at a temperature in a range of from 100 to 700° C.

18. A method of fabricating a semiconductor device, the method comprising:

providing a substrate having a PMOS transistor region and an NMOS transistor region defined therein;

forming a first gate structure on the PMOS transistor region and a second gate structure on the NMOS transistor region;

nitridating surfaces of a structure comprising the substrate and the first and second gate structures to form a first epitaxial blocking layer on first regions of the substrate located to the sides of the PMOS transistor region and a second epitaxial blocking layer on second regions of the substrate located to the sides of the NMOS transistor region, wherein the nitridating comprises forming plasma in a nitrogen-containing atmosphere and exposing the structure to the plasma;

removing the second epitaxial blocking layer from the second regions of the substrate;

subsequently forming one epitaxial layer on the second regions of the substrate while said first epitaxial blocking layer is disposed on the first regions of the substrate;

nitridating surfaces of said one epitaxial layer on the second regions of the substrate to form a third epitaxial blocking layer, wherein the nitridating comprises forming plasma in a nitrogen-containing atmosphere and exposing the structure to the plasma;

removing the first epitaxial blocking layer from the first regions of the substrate; and subsequently forming another epitaxial layer on the first regions of the substrate while said third epitaxial blocking layer is disposed on said one epitaxial layer.

* * * * *